US010126619B2

(12) United States Patent
Heo

(10) Patent No.: US 10,126,619 B2
(45) Date of Patent: Nov. 13, 2018

(54) DISPLAY DEVICE

(71) Applicant: Samsung Display Co. Ltd., Yongin-si (KR)

(72) Inventor: Yun Heo, Seoul (KR)

(73) Assignee: SAMSUNG DISPLAY CO. LTD., Gyeonggi-do (KR)

( * ) Notice: Subject to any disclaimer, the term of this patent is extended or adjusted under 35 U.S.C. 154(b) by 0 days.

(21) Appl. No.: 15/226,585

(22) Filed: Aug. 2, 2016

(65) Prior Publication Data
US 2017/0227826 A1 Aug. 10, 2017

(30) Foreign Application Priority Data

Feb. 5, 2016 (KR) ........................ 10-2016-0015145

(51) Int. Cl.
H01L 27/12 (2006.01)
G02F 1/1362 (2006.01)
G02F 1/1333 (2006.01)
G02F 1/1343 (2006.01)
G02F 1/1368 (2006.01)
H01L 29/417 (2006.01)

(52) U.S. Cl.
CPC ...... *G02F 1/136286* (2013.01); *G02F 1/1368* (2013.01); *G02F 1/133345* (2013.01); *G02F 1/134309* (2013.01); *G02F 1/134336* (2013.01); *G02F 1/136227* (2013.01); *H01L 27/124* (2013.01); *H01L 27/1248* (2013.01); *H01L 29/41733* (2013.01); *G02F 2001/134318* (2013.01); *G02F 2001/136254* (2013.01); *G02F 2201/121* (2013.01); *G02F 2201/123* (2013.01); *G02F 2201/40* (2013.01); *G02F 2203/01* (2013.01)

(58) Field of Classification Search
CPC ................................ G02F 1/136286
See application file for complete search history.

(56) References Cited

U.S. PATENT DOCUMENTS

| | | | | |
|---|---|---|---|---|
| 2006/0038180 A1* | 2/2006 | Lai | .................... | G02F 1/136259 257/72 |
| 2008/0284967 A1* | 11/2008 | Oh | .................... | G02F 1/134363 349/144 |
| 2009/0322977 A1* | 12/2009 | Chung | .............. | G02F 1/136259 349/48 |
| 2012/0050630 A1* | 3/2012 | Sato | .................. | G02F 1/134363 349/33 |
| 2014/0054624 A1* | 2/2014 | Chen | ..................... | H01L 27/156 257/89 |
| 2014/0183539 A1* | 7/2014 | Lee | ..................... | G02F 1/13624 257/72 |
| 2015/0221670 A1* | 8/2015 | Liu | ..................... | G02F 1/13624 257/72 |
| 2015/0268525 A1 | 9/2015 | Heo et al. | | |

* cited by examiner

*Primary Examiner* — Sitaramarao S Yechuri
(74) *Attorney, Agent, or Firm* — Cantor Colburn LLP

(57) ABSTRACT

A display device includes a first data line extending in a first direction, a first pixel electrode disposed at one side of the first data line and a second pixel electrode disposed at the other side of the first data line, where the first data line includes first and second branch lines branched from a first node and connected to a second node, the first pixel electrode is connected with the first branch line, and the second pixel electrode is connected with the second branch line.

15 Claims, 10 Drawing Sheets

DISPLAY DEVICE

This application claims priority to Korean Patent Application No. 10-2016-0015145, filed on Feb. 5, 2016, and all the benefits accruing therefrom under 35 U.S.C. § 119, the content of which in its entirety is herein incorporated by reference.

BACKGROUND

1. Field

Exemplary embodiments of the invention relate to a display device.

2. Description of the Related Art

The importance of a display device has increased with the development of multimedia. Accordingly, various types of display devices, such as a liquid crystal display ("LCD") device, an organic light emitting display ("OLED") device, and the like, have been used.

Among such display devices, an LCD device, which is one of the most widely used flat panel display devices, generally includes two substrates provided with field generating electrodes, such as a pixel electrode and a common electrode, and a liquid crystal layer disposed between the two substrates. In the LCD, a voltage is applied to the field generating electrodes to generate an electric field in the liquid crystal layer, and thus a direction of liquid crystal molecules in the liquid crystal layer is determined and the polarization of incident light, thereby displaying an image.

An LCD device may include a repair wiring located between a data line and a source electrode. The repair wiring refers to a wiring that is cut to check for operation at the time of a driving test of an LCD.

SUMMARY

A liquid crystal display has a disadvantage in terms of aperture ratio due to a repair wiring.

Exemplary embodiments of the invention provide a display device, which improves transmittance because it does not include a repair wring.

According to exemplary embodiments of the invention, a false operation is checked without including a repair wring.

Further, since a repair wring is not included, distance between pixel electrodes is narrowed, thereby improving transmittance.

However, exemplary embodiments of the invention are not restricted to the one set forth herein. The above and other exemplary embodiments of the invention will become more apparent to one of ordinary skill in the art to which the invention pertains by referencing the detailed description of the invention given below.

An exemplary embodiment of the invention discloses a display device including a first data line extending in a first direction, a first pixel electrode disposed at one side of the first data line and a second pixel electrode disposed at the other side of the first data line, where the first data line includes first and second branch lines branched from a first node and connected to a second node, the first pixel electrode is connected with the first branch line, and the second pixel electrode is connected with the second branch line.

An exemplary embodiment of the invention also discloses a display device including a substrate first and second gate lines extending on the substrate in a first direction and disposed adjacent to each other, a first data line extending on the first and second gate lines in a second direction different from the first direction and having the first and second gate lines, a first pixel electrode disposed at one side of the first data line, a second pixel electrode disposed at the other side of the first data line, a first switching device including a gate electrode connected with the first gate line, one electrode connected with the first data line, and the other electrode connected with the first pixel electrode, and a second switching device including a gate electrode connected with the second gate line, one electrode is connected with the first data line, and the other electrode is connected with the second pixel electrode.

An exemplary embodiment of the invention also discloses a display device including a substrate, first and second gate lines disposed on the substrate, a first data line disposed on the first and second gate lines and including first and second branch lines, a first switching device disposed on the same layer as that on which the first data line is disposed, and including one electrode connected with the first gate line and the first branch line, a second switching device disposed on the same layer as that on which the first data line is disposed, and including one electrode connected with the second gate line and the second branch line, a first pixel electrode connected with one electrode of the first switching device, a second pixel electrode connected with one electrode of the second switching device, and a common electrode at least partially overlapping the first and second pixel electrodes.

BRIEF DESCRIPTION OF THE DRAWINGS

The above and other exemplary embodiments and features of the invention will become more apparent by describing in detail exemplary embodiments thereof with reference to the attached drawings, in which.

DETAILED DESCRIPTION

Figure 1:
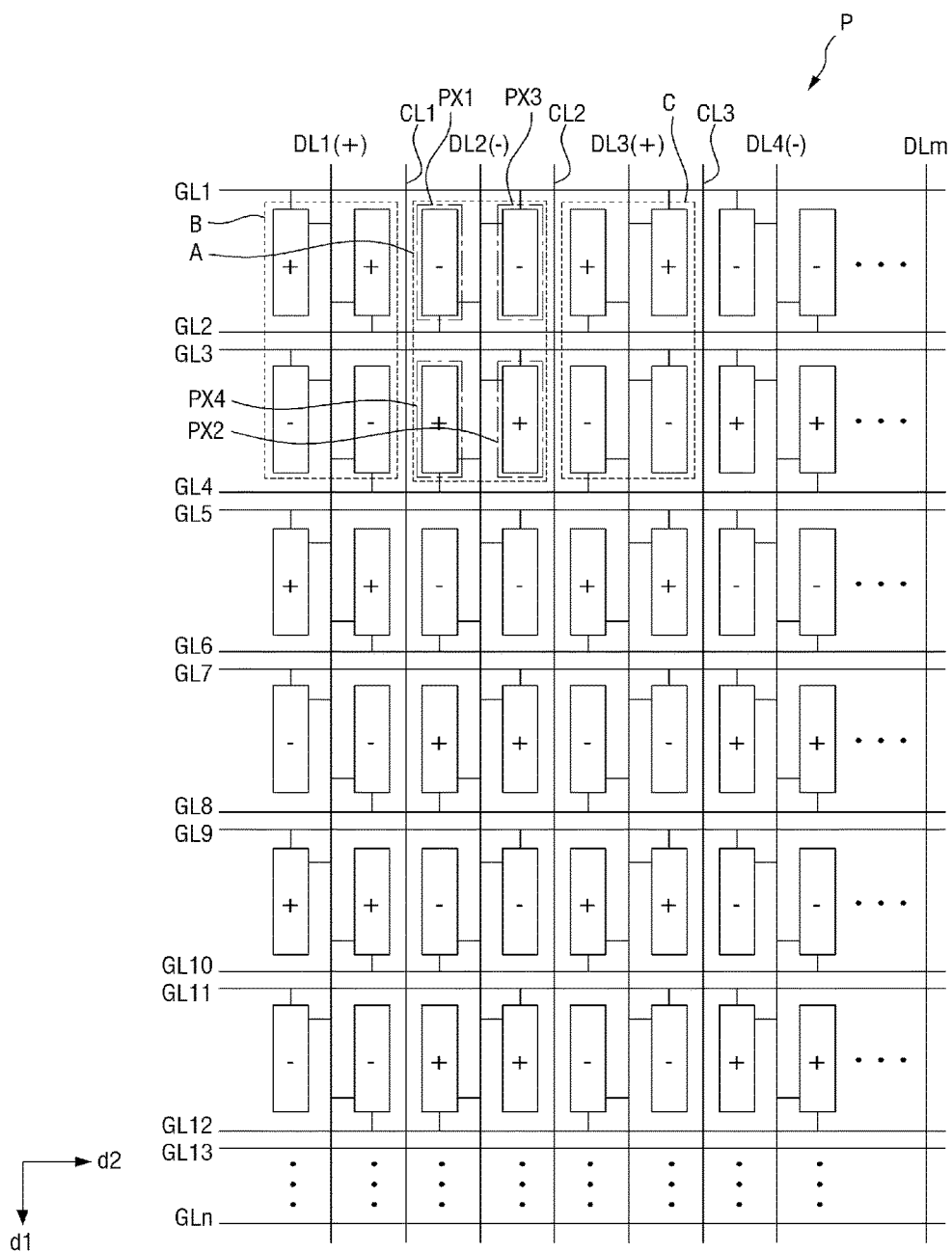
FIG. 1 is a schematic view of an exemplary embodiment of a display panel of a liquid crystal display device according to the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, preferred embodiments of the invention will be described in detail with reference to the attached drawings.

FIG. 1 is a schematic view of a display panel of a liquid crystal display ("LCD") device according to an exemplary embodiment of the invention.

Referring to FIG. 1, a display panel P may be connected with first to $n_{th}$ gate lines GL1 to GLn and first to $m_{th}$ data lines DL1 to DLm where n and m are natural numbers greater than 1. The first to $m_{th}$ data lines DL1 to DLm may extend in the first direction d1. The first to $n_{th}$ gate lines GL1 to GLn may extend in the second direction d2. The first direction d1 and the second direction d2 may vertically cross each other.

The first to $n_{th}$ gate lines GL1 to GLn may be connected with a gate drive unit (not show) to receive gate signals, respectively. The first to $m_{th}$ data lines DL1 to DLm may be connected with a data drive unit (not shown) to receive data signals, respectively. In FIG. 1, the first direction d1 is indicated by a column direction, and the second direction d2 is indicated by a row direction.

A plurality of data lines may receive positive (+) or negative (−) data signals from a data drive unit. Data signals having different polarity from each other may be applied to data lines adjacent to each other. In an exemplary embodiment, when a positive (+) data signal is applied to the first data line DL1, a negative (−) data signal may be applied to the second data line DL2, for example. In this case, th negative (−) data signal is a phase-inverted signal in contrast to the positive (+) data signal and the common voltage to be described later. The case that "the first and second data lines DL1 and DL2 are arranged adjacent to each other" means that another data line is not disposed between the first and second data lines DL1 and DL2. Further, the polarity of the data signals shown in FIG. 1 is only an example, and the polarity of data signals in the invention is not necessarily limited to the polarity of the data signals shown in FIG. 1.

Two pixel units arranged at both sides of one data line may be arranged to share the data line. Further, the two pixel units may be respectively connected with data lines different from each other. The relationship of arrangement of the plurality of pixel units in the display panel P will be described with reference to first to fourth pixel units PX1 to PX4 as an example.

The display panel P may include first to fourth pixel units PX1 to PX4. All of the first to fourth pixel units PX1 to PX4 may be connected with the second data line DL2. Further, the first to fourth pixel units PX1 to PX4 may be respectively connected with one of the first to fourth gate lines GL1 to GL4. Here, the first to fourth pixel units PX1 to PX4 may be respectively connected with data lines different from each other.

More specifically, the first pixel unit PX1 may be disposed at one side of the second data line DL2, and may be disposed between the first and second gate lines GL1 and GL2. Thus, the first pixel unit PX1 may receive a data signal from the second data line DL2 in response to a gate signal provided from the second gate line GL2.

The second pixel unit PX2 may be disposed at the other side of the second data line DL2, and may be disposed in a direction diagonal to the first pixel unit PX1. Further, the second pixel unit PX2 may be disposed between the third and fourth gate lines GL3 and GL4. Thus, the second pixel unit PX2 may receive a data signal from the second data line DL2 in response to a gate signal provided from the third gate line GL3.

The third pixel unit PX3 may be disposed at the other side of the second data line DL2, and may be disposed adjacent to the first pixel unit PX1. Further, the third pixel unit PX3 may be disposed between the first and second gate lines GL1 and GL2. Thus, the third pixel unit PX3 may receive a data signal from the second data line DL2 in response to a gate signal provided from the first gate line GL1.

The fourth pixel unit PX4 may be disposed at one side of the second data line DL2, and may be disposed in a direction diagonal to the third pixel unit PX3. Further, the fourth pixel unit PX4 may be disposed between the third and fourth gate lines GL3 and GL4. Thus, the fourth pixel unit PX4 may receive a data signal from the second data line DL2 in response to a gate signal provided from the fourth gate line GL4.

That is, all of the first to fourth pixel units PX1 to PX4 may share the second data line DL2, and may be respectively connected with the first to fourth gate lines GL1 to GL4 different from one another.

Similarly to this, other pixel units may be arranged in the display panel P as shown in FIG. 1. However, such an arrangement is not limited to that shown in FIG. 1. That is, according to another exemplary embodiment, the first pixel unit PX1 may be connected with the first gate line GL1 and the second gate line DL2, and the third pixel unit X3 adjacent to the first pixel unit PX1 may be connected to the second gate line GL2 and the second data line DL2. Further, the third pixel unit X3 may be connected with the fourth gate line GL4 and the second data line DL2, and the fourth pixel unit PX4 may be connected with the third gate line GL3 and the second data line DL2.

A plurality of pixel units arranged in the area B may be symmetrical with the first to fourth pixel units PX1 to PX4 arranged in the area A based on a first common line CL1 in the connection relationship with gate lines. In contrast, a plurality of pixel units arranged in the area C may be identical with the first to fourth pixel units PX1 to PX4 arranged in the area A based on a second common line CL2 in the connection relationship with gate lines.

In an exemplary embodiment, in the case where pixel units connected with the first data line DL1 and the first gate line GL1 sequentially display red, green, and blue colors in the second direction d2, for example, the display panel P is provided with the above-described arrangement relationship, thereby preventing the brightness of a pixel unit displaying a blue color and having the lowest brightness (for example, first pixel PX1) from being lowered by a kickback voltage.

Figure 2:
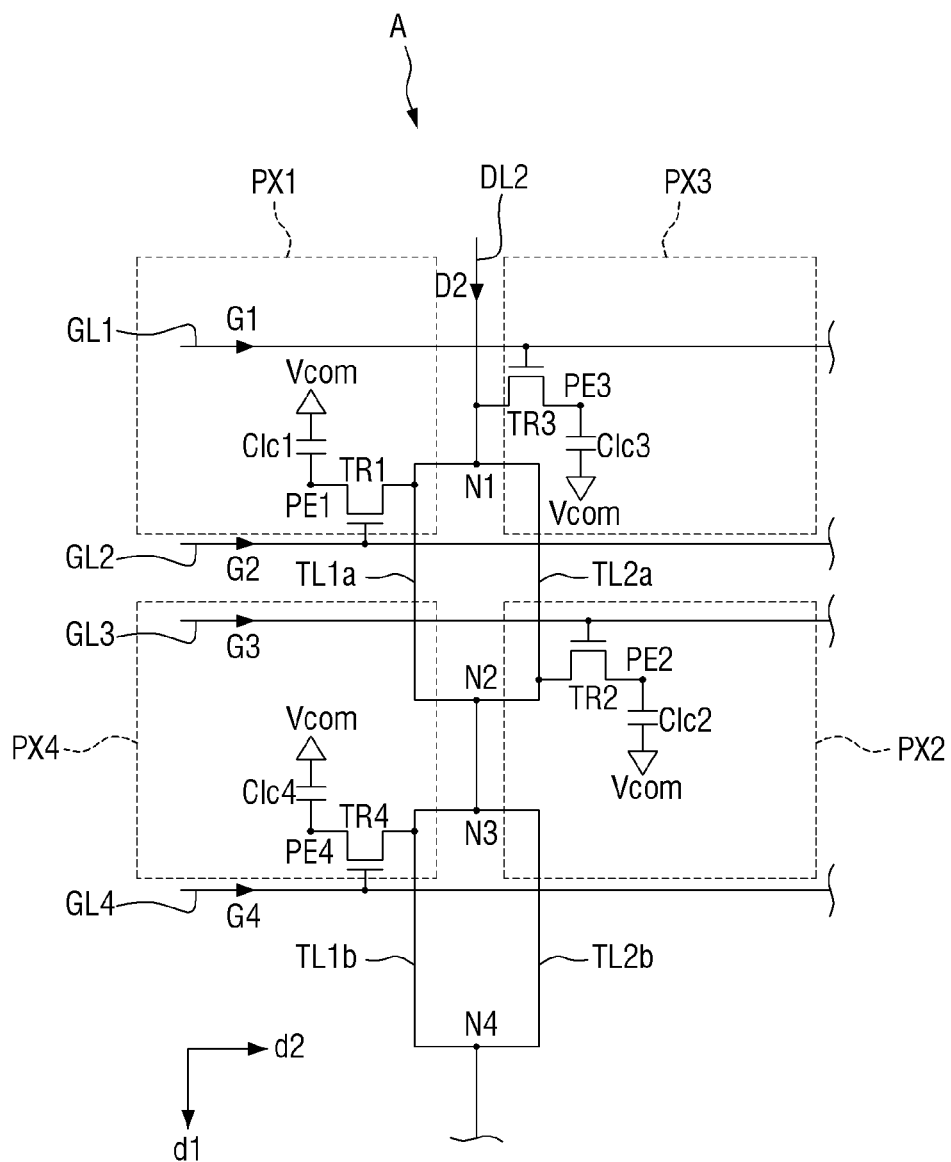
FIG. 2 is a schematic circuit diagram of the area A shown in FIG. 1.

However, the connection relationship is not necessarily limited to that shown in FIG. 2, and the plurality of pixel units arranged in the area C may be symmetrical with the first to fourth pixel units PX1 to PX4 arranged in the area A based on the first common line CL1 in the connection relationship with gate lines.

The display panel P may further include first to third common lines CL1 to CL3. Each of the first to third common lines CL1 to CL3 is disposed between the pixel units adjacent to each other, and is disposed not to overlap the first to $m_{th}$ data lines DL1 to DLm. That is, the first to third common lines CL1 to CL3 may extend in the first direction d1, and may also extend in parallel with the first to $m_{th}$ data lines DL1 to DLm in the same direction.

The first to third common lines CL1 to CL3 are connected with common electrodes CE to be described later, and may stabilize the ripple of a common voltage Vcom. In another exemplary embodiment, all of the first to third common lines CL1 to CL3 are not necessarily needed, and the second and third common lines CL2 and CL3 may be omitted. That is, the number and arrangement structure of the common lines may be suitably changed in consideration of ripple stabilization of the common voltage Vcom.

Hereinafter, the first to fourth pixel units PX1 to PX4 will be described in more detail with reference to FIG. 2.

FIG. 2 is a circuit diagram illustrating the area A in more detail.

The second data line DL2 may further include first and second branch lines TL1a and TL2a branched from a first node N1 and connected to a second node N2. Since the first branch line TL1a is electrically connected with the second branch line TL2a through the first and second nodes N1 and N2, the same signal (for example, second data signal D2) may be applied to the first branch line TL1a, the second branch line TL2a, and the first and second nodes N1 and N2.

The first pixel unit PX1 may include a first switching device TR1, a first pixel electrode PE1, and a first liquid crystal capacitor Clc1.

In an exemplary embodiment, the first switching device TR1 may be a three-terminal device such as a thin film transistor ("TFT"), for example. Hereinafter, in the specification, all switching devices including the first switching device TR1 will be exemplified as TFTs. The first switching device TR1 may include a gate electrode connected with the second gate line GL2, one electrode connected with the first pixel electrode PE1, and the other electrode connected with the first branch line TL1a of the second data line DL2. In the first switching device TR1, one electrode may be a source electrode, and the other electrode may be a drain electrode, for example. Hereinafter, in the specification, one electrode of the first switching device TR1 will be designated as a source electrode, and the other electrode thereof will be designated as a drain electrode. The first switching device TR1 may be turned on by a second gate signal G2 provided from the second gate line GL2, and may apply a second data signal D2 provided from the second data line DL2 and the first branch line TL1a to the first pixel electrode PE1.

Figure 4:
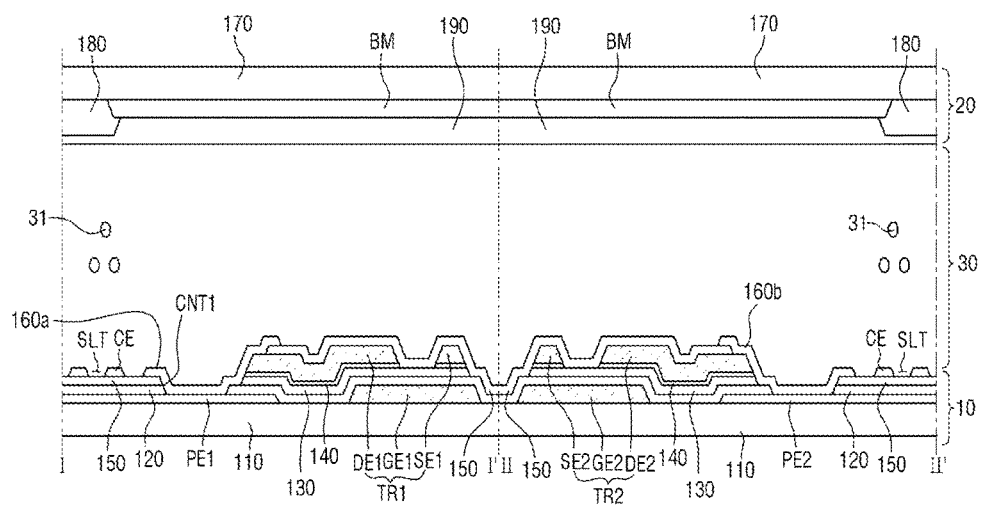
FIG. 4 is a cross-sectional view taken along lines I-I' and II-II' of FIG. 3.

The first liquid crystal capacitor Clc1 may be disposed between the first pixel electrode PE1 and a common electrode CE (refer to FIG. 4). That is, the first liquid crystal capacitor Clc1 is charged with a voltage difference between a voltage applied to the first pixel electrode PE1 and a common voltage Vcom applied to the common electrode CE.

The second pixel unit PX2 may include a second switching device TR2, a second pixel electrode PE2, and a second liquid crystal capacitor Clc2.

The second switching device TR2 may be a three-terminal device such as a TFT. The second switching device TR2 may include a gate electrode connected with the third gate line GL3, one electrode connected with the second pixel electrode PE2, and the other electrode connected with the second branch line TL2a of the second data line DL2. In the second switching device TR2, one electrode may be a source electrode, and the other electrode may be a drain electrode. The second switching device TR2 may be turned on by a third gate signal G3 provided from the third gate line GL3, and may apply a second data signal D2 provided from the second data line DL2 and the second branch line TL2a to the second pixel electrode PE2.

The second liquid crystal capacitor Clc2 may be disposed between the second pixel electrode PE2 and a common electrode CE (refer to FIG. 4). That is, the second liquid crystal capacitor Clc2 is charged with a voltage difference between a voltage applied to the second pixel electrode PE2 and a common voltage Vcom applied to the common electrode CE.

Since the third pixel unit PX3 and the fourth pixel unit PX4 are the same as the first pixel unit PX1 and the second pixel unit PX2 except for connection relationship of third and fourth switching devices TR3 and TR4 and received data signals, duplicate descriptions will be omitted.

The third pixel unit PX3 may be directly to the second data line DL2 by being connected with the first gate line GL1, but the invention is not limited thereto. That is, the third pixel unit PX3 may be connected with the second branch line TL2a branched from the second data line DL2.

The second data line DL2 may further include third and fourth branch lines TL1b and TL2b branched from a third node N3 and connected to a fourth node N4. The fourth pixel unit PX4 may include a fourth switching device TR4 connected with the third branch line TL1b branched from the third node N3, and a fourth pixel electrode PE4 connected with the fourth switching device TR4.

That is, two pixel units adjacent to each other in a diagonal direction and sharing one data line may be respectively connected with two branch lines branched from one node. Therefore, hereinafter, the invention will be described in more detail based on the second data line DL2, the second gate line GL2, the third gate line GL3, and the first and second pixel units PX1 and PX2 with reference to FIGS. 3 to 5.

Figure 3:
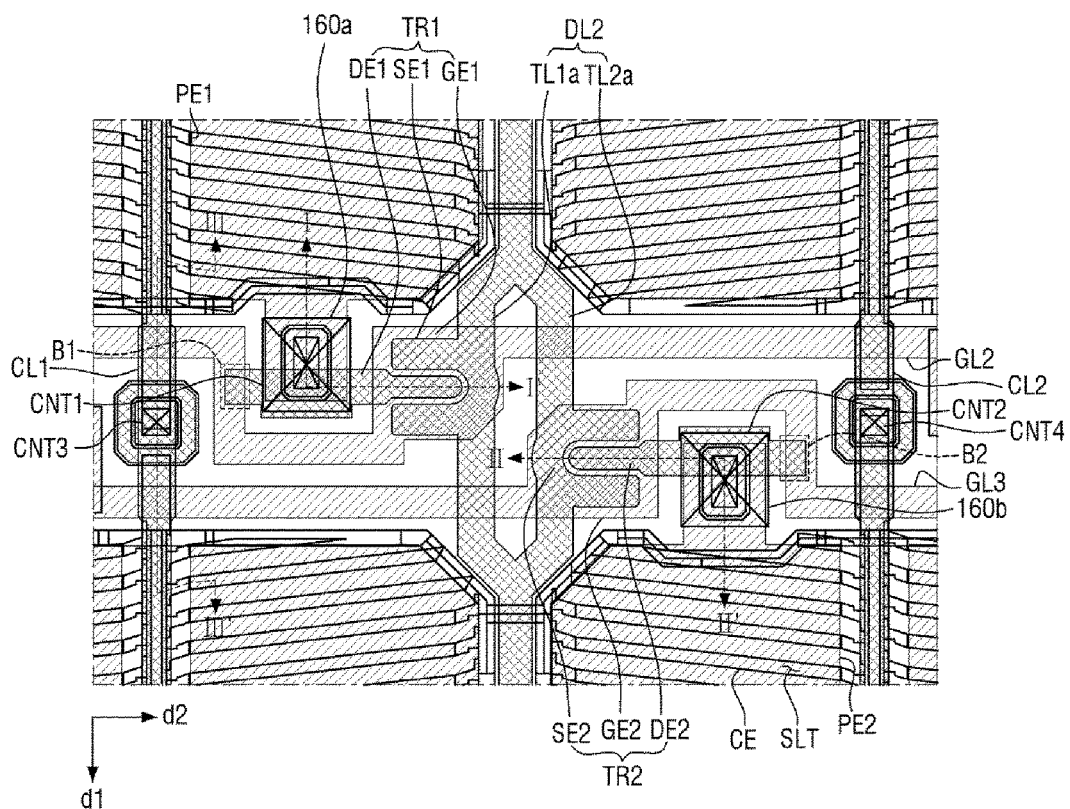
FIG. 3 is a plan view schematically illustrating an exemplary embodiment of the area A shown in FIG. 1.
Figure 5:
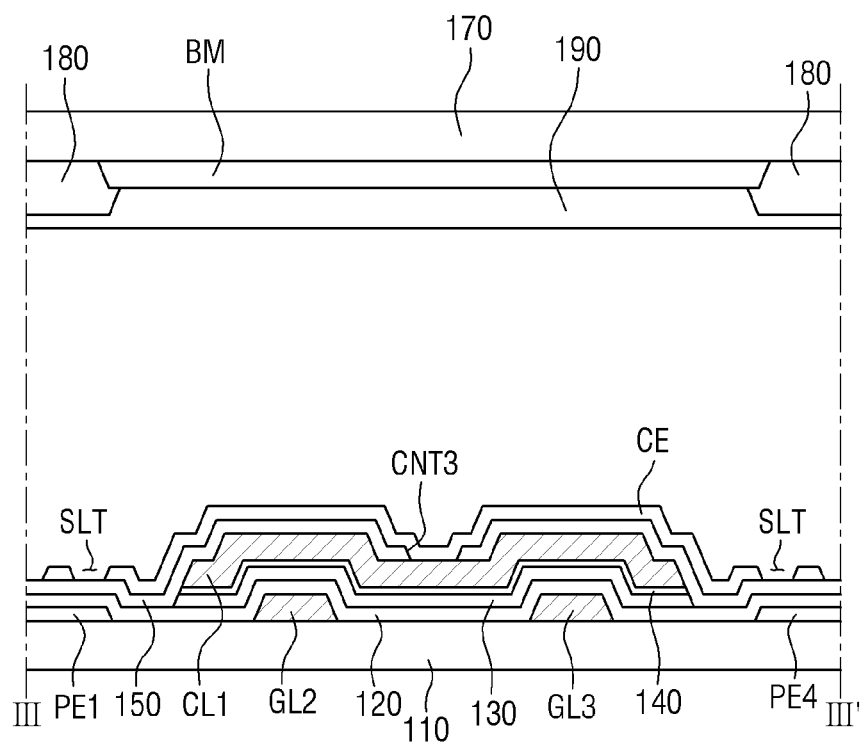
FIG. 5 is a cross-sectional view taken along line of FIG. 3.

FIG. 3 is a plan view schematically illustrating an exemplary embodiment of the area A shown in FIG. 1. FIG. 4 is a cross-sectional view taken along lines I-I' and II-II' of FIG. 3. FIG. 5 is a cross-sectional view taken along line of FIG. 3. For the convenience of explanation, the invention will be described based on the first and second pixel units PX1 and PX2 shown in FIG. 2.

Referring to FIGS. 3 to 5, a display device according to an exemplary embodiment of the invention may include a lower display panel 10 and an upper display panel 20. The lower display panel 10 is disposed to face the upper display panel 20. The lower display panel 10 may be attached to the upper display panel 20 by sealing. The display device may further include a liquid crystal layer 30 interposed between the lower display panel 10 and the upper display panel 20. Therefore, the display device according to an exemplary embodiment of the invention may be an LCD device.

For the convenience of explanation, hereinafter, the source and drain electrodes of the first switching device TR1 are respectively designated by first source electrode SE1 and first drain electrode DE1. Further, the source and drain electrodes of the second switching device TR2 are respectively designated by second source electrode SE2 and second drain electrode DE2.

First, the lower display panel 10 will be described.

In an exemplary embodiment, a lower substrate 110 may be a transparent glass substrate, a transparent plastic substrate, or the like, for example.

The second gate line GL2, the third gate line GL3, and the first and second gate electrodes GE1 and GE2 may be disposed on the lower substrate 110. The first and second pixel electrodes PE1 and PE2 may be disposed on the lower substrate 110. That is, the first and second pixel electrodes PE1 and PE2 may be disposed on the same layer as that on which the second gate line GL2, the third gate line GL3, and the first and second gate electrodes GE1 and GE2 are disposed.

The second and third gate lines GL2 and GL3 may be respectively insulated from the first and second pixel electrodes PE1 and PE2. Accordingly, in the case where the second and third gate lines GL2 and GL3 are respectively disposed on the same layer as that on which the first and second pixel electrodes PE1 and PE2 are disposed, but are respectively insulated from the first and second pixel electrodes PE1 and PE2, the arrangement thereof is not limited to that shown in FIG. 3.

In an exemplary embodiment, the second gate line GL2, the third gate line GL3, and the first and second gate electrodes GE1 and GE2 may be respectively provided in the form of a single layer, a double layer, or a triple layer respectively including one, two, or three conductive metals including aluminum (Al), copper (Cu), molybdenum (Mo), chromium (Cr), titanium (Ti), tungsten (W), molybdenum-tungsten (Mo—W), molybdenum titanium (Mo—Ti), copper/molybdenum-titanium (Cu/Mo—Ti) or any combinations thereof.

In an exemplary embodiment, the first and second pixel electrodes PE1 and PE2 may include a transparent conductive material such as indium tin oxide ("ITO") or indium zinc oxide ("IZO"), or a reflective material such as aluminum, silver, chromium, or an alloy thereof. Further, in an exemplary embodiment, the first and second pixel electrodes PE1 and PE2 may be provided in the shape of a plate in which no slit is defined, but the invention is not limited thereto.

A gate insulating film 120 may be disposed on the second gate line GL2, the third gate line GL3, the first gate electrode GE1, the second gate electrode GE2, and the first and second pixel electrodes PE1 and PE2. In an exemplary embodiment, the gate insulating film 120 may include silicon nitride ($SiN_x$) or silicon oxide ($SiO_x$), for example. The gate insulating film 120 may have a multi-layer structure including at least two layers having different physical properties from each other.

A semiconductor layer 130 may be disposed on the gate insulating film 120. The semiconductor layer 130 may include a oxide semiconductor. That is, in an exemplary embodiment, the semiconductor layer 130 may include one oxide semiconductor including In—Ga-Zinc-Oxide ("IGZO"), ZnO, ZnO$_2$, CdO, SrO, SrO$_2$, CaO, CaO$_2$, MgO, MgO$_2$, InO, In$_2$O$_2$, GaO, Ga$_2$O, Ga$_2$O$_3$, SnO, SnO$_2$, GeO, GeO$_2$, PbO, Pb$_2$O$_3$, Pb$_3$O$_4$, TiO, TiO$_2$, Ti2O3, Ti$_3$O$_5$ or any combinations thereof, for example.

In another exemplary embodiment, the semiconductor layer 130 may include amorphous silicon or polycrystalline silicon. The semiconductor layer 130 may include a channel region of the first switching device TR1 and a channel region of the second switching device TR2.

A resistive contact layer 140 may be disposed on the semiconductor layer 130. In an exemplary embodiment, the resistive contact layer 140 may include n+ hydrogenated amorphous silicon doped with n-type impurity such as phosphorus, or silicide, for example. However, in the case where the semiconductor layer 130 includes oxide semiconductor, the resistive contact layer 140 may be omitted.

A second data line DL2, a first source electrode SE1, a second source electrode SE2, a first drain electrode DE1, and a second drain electrode DE2 may be disposed on the gate insulating film 120 and the resistive contact layer 140. The second data line DL2, the first source electrode SE1, the second source electrode SE2, the first drain electrode DE1, and the second drain electrode DE2 may be respectively provided in the form of a single layer, a double layer, or a triple layer including one, two, or three conductive metals selected from aluminum (Al), copper (Cu), molybdenum (Mo), chromium (Cr), titanium (Ti), tungsten (W), molybdenum-tungsten (Mo—W), molybdenum titanium (Mo—Ti), and copper/molybdenum-titanium (Cu/Mo—Ti). However, the invention is not limited thereto, and they may include various metals or conductors.

In an exemplary embodiment, the second data line DL2, the first source electrode SE1, the second source electrode SE2, the first drain electrode DE1, and the second drain electrode DE2 may be provided together with the semiconductor layer 130 and the resistive contact layer 140 by the same mask process. In this case, the second data line DL2, the first source electrode SE1, the second source electrode SE2, the first drain electrode DE1, and the second drain electrode DE2 may have the substantially same shape as the semiconductor layer 130, except for the channel regions of the first and second switching device TR1 and TR2.

The second data line DL2 may include first and second branch lines TL1a and TL2a branched from the first node N1 (refer to FIG. 2) and connected to the second node N2 (refer to FIG. 2). The first branch line TL1a and the second branch line TL2a may be disposed to extend in the substantially same direction as each other, for example, in the first direction d1. The first branch line TL1a and the second branch line TL2a may be disposed to be spaced apart from each other by a predetermined distance.

The first source electrode SE1, the first drain electrode DE1, and the first gate electrode GE1 may constitute the first switching device TR1.

The first source electrode SE1 of the first switching device TR1 may be connected with the second data line DL2, more specifically, the first branch line TL1a. Further, the first source electrode SE1 of the first switching device TR1 may be unitary with the first branch line TL1a. In an exemplary embodiment, the first source electrode SE1 of the first switching device TR1 may have a U shape, for example.

The first drain electrode DE1 of the first switching device TR1 may be electrically connected with the first pixel electrode PE1 through a first contact hole CNT1 and a first connecting electrode 160a to be described later. In an exemplary embodiment, the first drain electrode DE1 of the first switching device TR1 may have a U shape, for example. One side of the first drain electrode DE1 may at least partially overlap the first gate electrode GE1, and the other side of the first drain electrode DE1 may at least partially overlap the second gate line GL2 in a region B1. Accordingly, the first pixel unit PX1 may further include a storage capacitor provided between the second gate line GL2 and the other side of the first drain electrode DE1.

The second source electrode SE2, the second drain electrode DE2, and the second gate electrode GE2 may constitute the second switching device TR2.

The second source electrode SE2 of the second switching device TR2 may be connected with the second data line DL2, more specifically, the second branch line TL2a. Further, second source electrode SE2 of the second switching device TR2 may be unitary with the second branch line TL2a. In an exemplary embodiment, the second source electrode SE2 of the second switching device TR2 may have a U shape, for example.

The second source electrode SE2 of the second switching device TR2 may be electrically connected with the second pixel electrode PE2 through a second contact hole CNT2 and a second connecting electrode 160b to be described later. In an exemplary embodiment, the second source electrode SE2 of the second switching device TR2 may have a U shape, for example. One side of the second drain electrode DE2 may at least partially overlap the third gate electrode GE3, and the other side of the second drain electrode DE2 may at least partially overlap the third gate line GL3 in a region B2. Accordingly, the second pixel unit PX2 may further include a storage capacitor provided between the third gate line GL3 and the other side of the second drain electrode DE2.

In the display device according to an exemplary embodiment of the invention, when defects occur in the second switching device TR2 and the second pixel electrode PE2 connected therewith, only the second branch line TL2a connected with the second pixel electrode PE2 may be cut. Accordingly, even when the second branch line TL2a is cut, the first branch line TL1a is electrically connected with the second data line DL2. The first switching device TR1 normally receives a second data signal D2 from the second data line DL2, and provides this second data signal D2 to the second pixel electrode PE2.

That is, the second data line DL2 is branched into first and second branch lines TL1a and TL2a, and thus it is possible to remove only the defective line of the two branch lines. Accordingly, another repair wiring is not desired between the first branch line TL1a and the first source electrode SE1 or between the second branch line TL2a and the second source electrode SE2. Therefore, the first source electrode SE1 of the first switching device TR1 may be unitary with the first branch line TL1a, and the second source electrode SE2 of the second switching device TR2 may be unitary with the second branch line TL2a.

Thus, another repair wiring may not be provided between a data line and one electrode of a switching device. Since another repair wiring is not provided, the distance between the first and second pixel electrode PE1 and PE2 spaced apart from each other may be narrowed. Therefore, the aperture ratio of the display device according to an exemplary embodiment of the invention may be improved. Since the distance between the first and second pixel electrode PE1 and PE2 may be narrowed, the width of a black matrix BM disposed between the first and second pixel electrode PE1 and PE2 may be reduced.

The first and second common lines CL1 and CL2 may be disposed on the gate insulating film 120 and the resistive contact layer 140.

The first and second common lines CL1 and CL2 may be disposed on the same layer as that on which the second data line DL2, the first source electrode SE1, the second source electrode SE2, the first drain electrode DE1, and the second drain electrode DE2 are disposed. In an exemplary embodiment, the first and second common lines CL1 and CL2 may include the same material as that of the second data line DL2, the first source electrode SE1, the second source electrode SE2, the first drain electrode DE1, and the second drain electrode DE2, and may be provided together with the second data line DL2, the first source electrode SE1, the second source electrode SE2, the first drain electrode DE1, and the second drain electrode DE2 by the same mask process.

The first and second common lines CL1 and CL2 may be electrically connected with a common electrode CE to be described later. The first and second common lines CL1 and CL2 are electrically connected with the common electrode CE to reduce the ripple of a common voltage Vcom, thereby stabilizing the common voltage Vcom.

More specifically, the first common line CL1 may be electrically connected with the common electrode CE by contacting the common electrode CE through a third contact hole CNT3. The third contact hole CNT3 electrically connecting the first common line CL1 and the common electrode CE is defined in a region covered by a black matrix BM to be described later. When the third contact hole CNT3 is defined in a pixel region, the black matrix BM is desired to be extended to cover the third contact hole CNT3. However, in the display device according to an exemplary embodiment of the invention, since the third contact hole CNT3 is defined in the region covered by the black matrix BM, the black matrix BM does not need to be extended.

Similarly, the second common line CL2 may be electrically connected with the common electrode CE by contacting the common electrode CE through a fourth contact hole CNT4. The fourth contact hole CNT4 electrically connecting the second common line CL2 and the common electrode CE is disposed in a region covered by a black matrix BM to be described later.

In an exemplary embodiment, the first and second common lines CL1 and CL2 may be disposed to extend in the first direction d1. That is, the first and second common lines CL1 and CL2 may be disposed to extend in the same direction as the second data line DL2. The second data line DL2 may be disposed between the first and second common lines CL1 and CL2.

A passivation film 150 may be disposed on the gate insulating film 120, the second data line DL2, the first source electrode SE1, the second source electrode SE2, the first drain electrode DE1, the second drain electrode DE2, and the first and second common lines CL1 and CL2. In an exemplary embodiment, the passivation may include an inorganic insulating material such silicon nitride or silicon oxide.

A common electrode CE may be disposed on the passivation film 150. The common electrode CE may be provided to at least partially overlap the first and second pixel electrodes PE1 and PE2.

In an exemplary embodiment, the common electrode CE may include a transparent conductive material such as ITO or IZO, or a reflective metal such as aluminum, silver, chromium or an alloy thereof. The common electrode CE may be electrically connected with a portion of the first common line CL1, the portion being exposed through the third contact hole CNT3. The common electrode CE may be electrically connected with a portion of the second common line CL2, the portion being exposed through the fourth contact hole CNT4.

A plurality of slits SLT may be defined in the common electrode CE. In an exemplary embodiment, the plurality of slits SLT may be defined to extend in the second direction d2, but the invention is not limited thereto. That is, in another exemplary embodiment, the plurality of slits SLT may also be defined to extend in the first direction d1. The plurality of slits SLT is defined in the common electrode CE, thereby forming a horizontal electric field in relation to the first and second pixel electrodes PE1 and PE2.

More specifically, the common electrode CE form a fringe field together with each of the first and second pixel electrodes PE1 and PE2 through the plurality of slits SLT, thereby rotating or aligning a plurality of liquid crystal molecules 31 in a specific direction. However, the shape, sectional structure and number of the slits SLT of the common electrode CE are not limited to those shown in FIGS. 3 to 5.

First and second connecting electrode 160a and 160b may be disposed on the passivation film 150. The first and the second connection electrode 160a and 160b may be disposed on the same layer as that on which the common electrode CE is disposed. However, the first and the second connection electrode 160a and 160b are not electrically connected with the common electrode CE. In an exemplary embodiment, the first and the second connection electrode 160a and 160b may include a transparent conductive material such as ITO or IZO, or a reflective metal such as aluminum, silver, chromium or an alloy thereof. That is, in an exemplary embodiment, the first and the second connection electrode 160a and 160b may include the same material as that of the common electrode CE, and, in this case, may be provided together with the common electrode CE by the same mask process.

The first connecting electrode 160a may be provided to cover the first contact hole CNT 1. More specifically, the first contact hole CNT1 may be provided to expose a part of the first pixel electrode PE1 and a part of the first drain electrode DE1 of the first switching device TR1. The first connecting electrode 160a may be provided to cover a part of the exposed first pixel electrode PE1 and a part of the exposed first drain electrode DE1. Therefore, the first connecting electrode 160a may electrically connect the first pixel electrode PE1 and the first drain electrode DE1.

The second connecting electrode 160b may be provided to cover the second contact hole CNT 2. The second connecting electrode 160b may be provided to expose a part of the second pixel electrode PE2 and a part of the second drain electrode DE2 of the second switching device TR2. The second connecting electrode 160b may be provided to cover a part of the exposed second pixel electrode PE2 and a part of the exposed second drain electrode DE2, so as to electrically connect the second pixel electrode PE2 and the second drain electrode DE2.

Although not shown in the drawings, an alignment film (not shown) may be disposed on the common electrode CE and the passivation film 150. In an exemplary embodiment, the alignment film may be a horizontal alignment film, and is rubbed in a predetermined direction. In another exemplary embodiment, the alignment film may include a photoreactive material, and may be optically aligned.

Next, the upper display panel 20 will be described.

An upper substrate 170 may be disposed to face the lower substrate 110. In an exemplary embodiment, the upper substrate 170 may include transparent glass, plastic, or the like. In an exemplary embodiment, the upper substrate 170 may include the same material as that of the lower substrate 110.

A black matrix BM for blocking the transmission of light to a region other than the pixel region may be disposed on the upper substrate 170. In an exemplary embodiment, the black matrix BM may include an organic material or a metallic material including chromium, for example.

A color filter 180 may be disposed on the black matrix BM and the upper substrate 170. More specifically, in an exemplary embodiment, the color filter 180 may display any one of red (R), green (G), and blue (B), for example. However, the color filter 180 is not provided only on the upper substrate 170. That is, the color filter 180 may also be disposed on the lower substrate 110.

An overcoat layer 190 may be disposed on the black matrix BM and the color filter 180. The overcoat layer 190 covers the color filter 180 and the black matrix BM to perform a planarization. The overcoat layer 190 may be omitted according to circumstances.

Although not shown in the drawings, an alignment film (not shown) may be disposed on the overcoat layer 190. In an exemplary embodiment, the alignment film may be a horizontal alignment film, and is rubbed in a predetermined direction, for example. In another exemplary embodiment, the alignment film may include a photoreactive material, and may be optically aligned.

Figure 6:
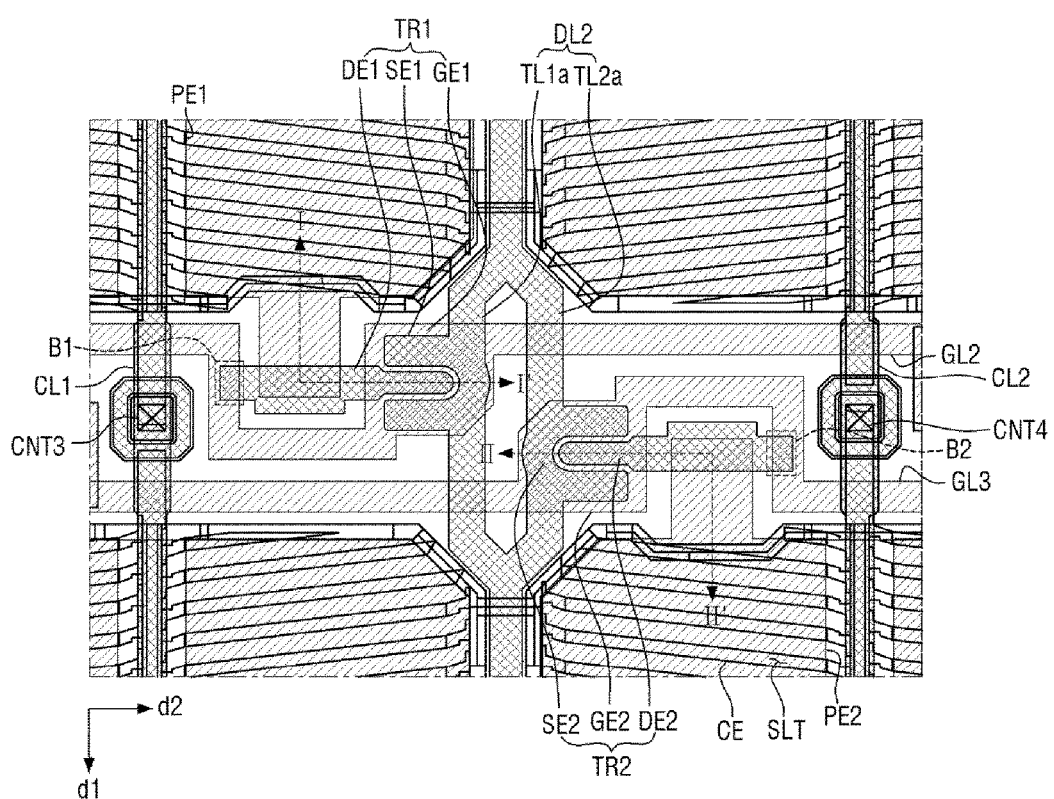
FIG. 6 is a plan view more specifically illustrating another exemplary embodiment of the area A shown in FIG. 1.
Figure 7:
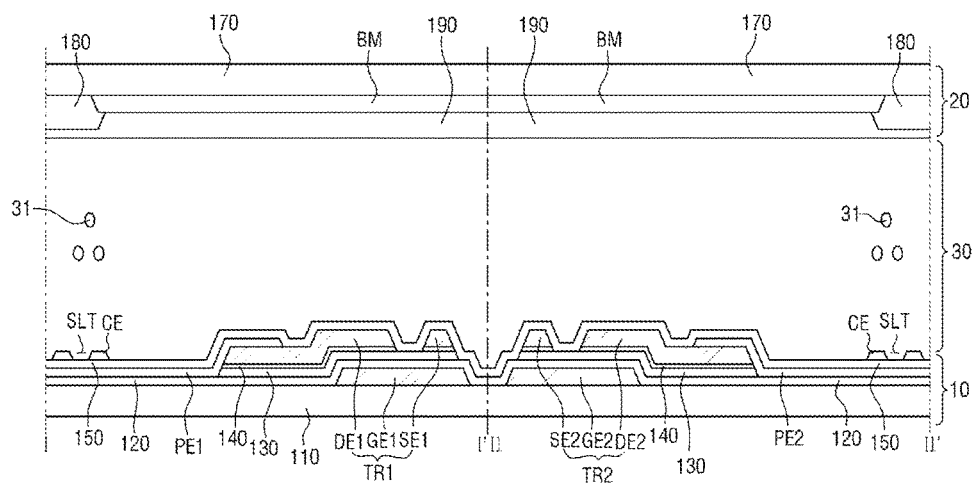
FIG. 7 is a cross-sectional view taken along lines I-I' and II-II' of FIG. 6.

FIG. 6 is a plan view more specifically illustrating another exemplary embodiment of the area A shown in FIG. 1. FIG. 7 is a cross-sectional view taken along lines I-I' and II-II' of FIG. 6.

Here, contents overlapping those that have been described with reference to FIGS. 3 to 5 will be omitted.

Referring to FIGS. 6 and 7, in the display device according to another exemplary embodiment of the invention, the arrangement of the first and second pixel electrodes PE1 and PE2 is different from that in the display device having described with reference to FIGS. 3 to 5.

That is, the first and second pixel electrodes PE1 and PE2 may be disposed on a different layer from that on which the second gate line GL2, the third gate line GL3, and the first and second gate electrodes GE1 and GE2 are disposed.

More specifically, the first pixel electrode PE1 may be disposed on the gate insulating film 120 and the first drain electrode DE1 of the first switching device TR1. The first pixel electrode PE1 may be disposed on the first drain electrode DE1 to directly contact the first drain electrode DE1. Therefore, the first drain electrode DE1 and the first pixel electrode PE1 may be electrically connected with each other without another connecting electrode and another contact hole, for example, the first connecting electrode 160a (refer to FIGS. 3 and 4) and the first contact hole CNT1 (refer to FIGS. 3 and 4).

The second pixel electrode PE2 may be disposed on the gate insulating film 120 and the second drain electrode DE2 of the second switching device TR2. The second pixel electrode PE2 may be disposed on the second drain electrode DE2 to directly contact the second drain electrode DE2. Therefore, the second drain electrode DE2 and the second pixel electrode PE2 may be electrically connected with each other without another connecting electrode and another contact hole, for example, the second connecting electrode 160b (refer to FIGS. 3 and 4) and the second contact hole CNT2 (refer to FIGS. 3 and 4).

The passivation film 150 may be disposed on the first and second electrodes PE1 and PE2 in addition to the gate insulating film 120, the second data line DL2, the first source electrode SE1, the second source electrode SE2, the first drain electrode DE1, the second drain electrode DE2, and the first and second common lines CL1 and CL2.

It has been described with reference to FIGS. 3 to 5 that the first and second pixel electrodes PE1 and PE2 are disposed on the same layer as that on which the second and third gate lines GL2 and GL3 are disposed, and it has been described with reference to FIGS. 6 and 7 that the first and second pixel electrodes PE1 and PE2 directly contact the first and second drain electrodes DE1 and DE2, respectively. However, the invention is not limited thereto.

That is, the passivation film 150 may be disposed on the second data line DL2, the first source electrode SE1, the second source electrode SE2, the first drain electrode DE1, and the second drain electrode DE2, and the first and second pixel electrodes PE1 and PE2 may be disposed on the passivation film 150. In this case, the first and second pixel electrodes PE1 and PE2 may be respectively connected with the first and second drain electrodes DE1 and DE2 exposed through the contact holes defined in the passivation film 150.

Figure 8:
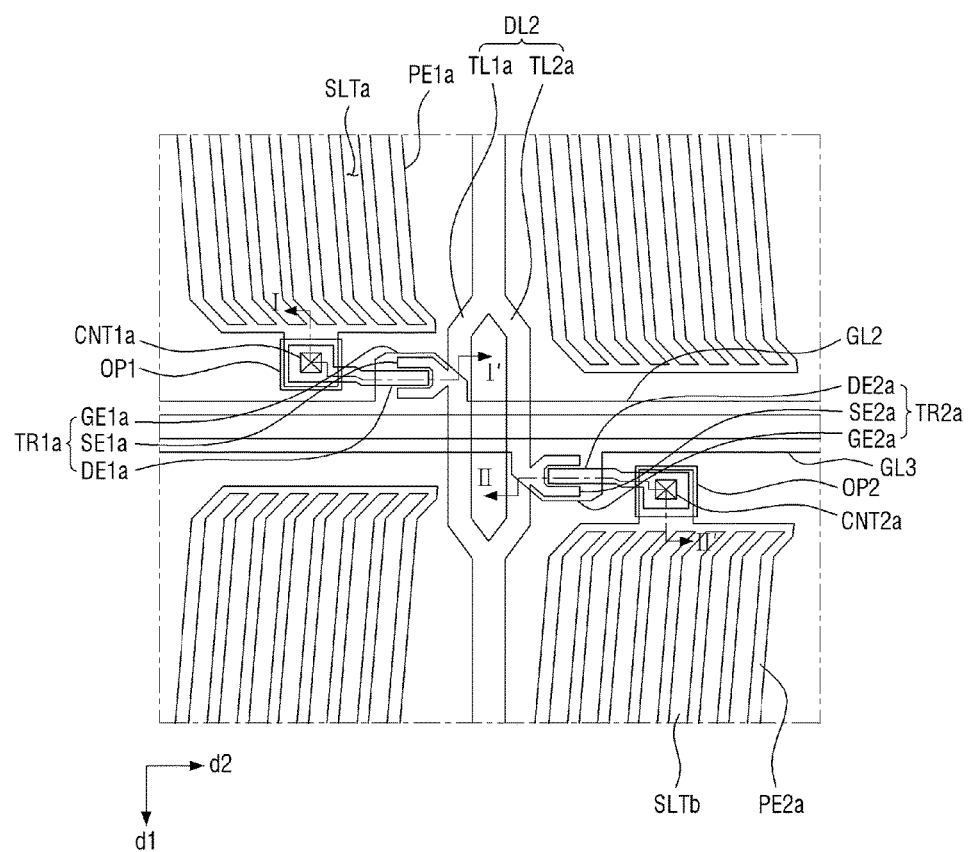
FIG. 8 is a plan view more specifically illustrating another exemplary embodiment of the area A shown in FIG. 1.
Figure 9:
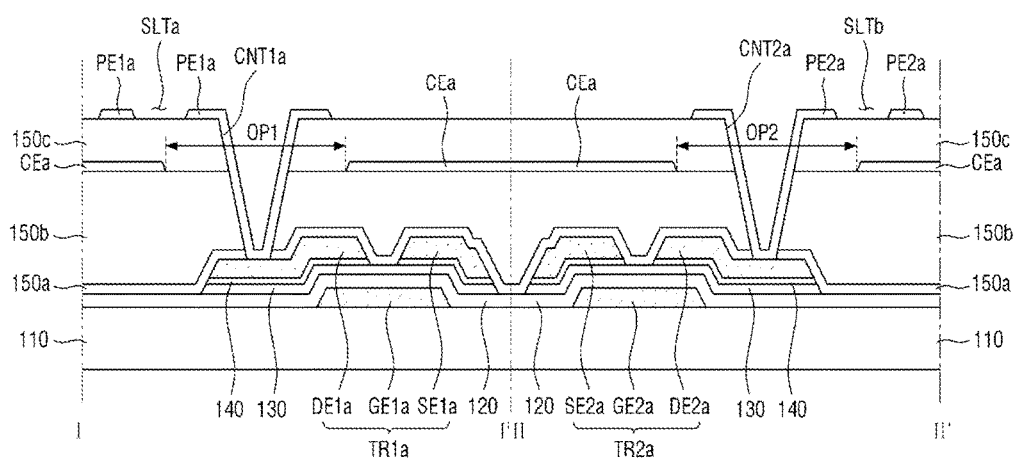
FIG. 9 is an example of a cross-sectional view taken along lines I-I' and II-II' of FIG. 8.
Figure 10:
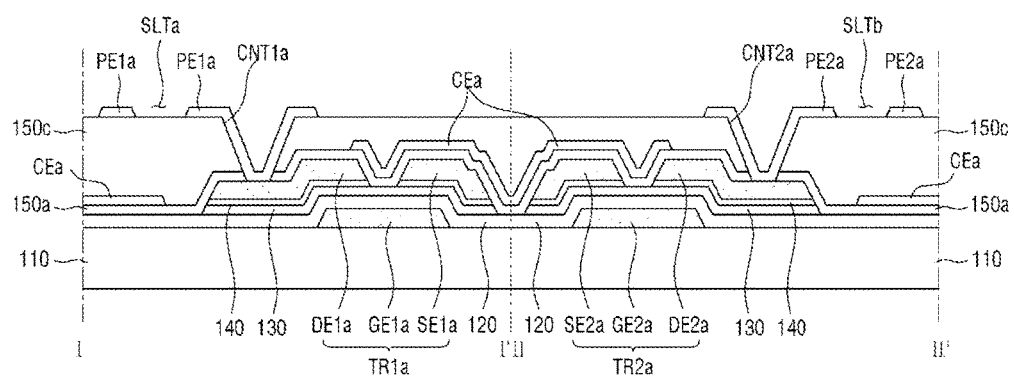
FIG. 10 is another example of a cross-sectional view taken along lines I-I' and II-II' of FIG. 8.

FIG. 8 is a plan view more specifically illustrating another exemplary embodiment of the area A shown in FIG. 1. FIG. 9 is an example of a cross-sectional view taken along lines I-I' and II-II' of FIG. 8. FIG. 10 is another example of a cross-sectional view taken along lines I-I' and II-II' of FIG. 8.

Here, contents overlapping those that have been described with reference to FIGS. 3 to 5 or FIGS. 6 and 7 will be omitted.

First, referring to FIGS. 8 and 9, the display device according to another exemplary embodiment of the invention may further include an organic insulating film 150b.

More specifically, the second gate line GL2, the third gate line GL3, and the first and second gate electrodes GE1a and GE2a may be disposed on the lower substrate 110. The gate insulating film 120 may be disposed on the second gate line GL2, the third gate line GL3, the first gate electrode GE1a, and the second gate electrode GE2a.

The semiconductor layer 130 may be disposed on the gate insulating film 120. The resistive contact layer 140 may be disposed on the semiconductor layer 130. As described above, the resistive contact layer 140 may be omitted when it includes an oxide semiconductor.

The second data line DL2, the first source electrode SE1a, the second source electrode SE2a, the first drain electrode DE1a, and the second drain electrode DE2a may be disposed on the gate insulating film 120 and the resistive contact layer 140. The second data line may further include the first and second branch lines TL1a and TL2a branched from the first node N1 (refer to FIG. 2) and connected to the second node N2 (refer to FIG. 2). The first and second branch lines TL1a and TL2a may be disposed to extend in the substantially same direction, that is, in the first direction d1. The first and second branch lines TL1a and TL2a may be provided to be space apart from each other by a predetermined distance. The first gate electrode GE1a, the first source electrode SE1a and the first drain electrode DE1a provides a first transistor TR1a, and the second gate electrode GE2a, the second source electrode SE2a and the second drain electrode DE2a provides a second transistor TR2a.

The first and second common lines CL1 and CL2 (refer to FIG. 3) may be disposed on the gate insulating film 120 and the resistive contact layer 140. That is, the first and second common lines CL1 and CL2 may be disposed on the same layer as that on which the second data line DL2, the first source electrode SE1a, the second source electrode SE2a, the first drain electrode DE1a, and the second drain electrode DE2a are disposed.

The passivation film 150a may be disposed on the second data line DL2, the first source electrode SE1a, the second source electrode SE2a, the first drain electrode DE1a, and the second drain electrode DE2a, so as to prevent the contaminants in the process from flowing into the semiconductor layer 130.

The organic insulating film 150b may be disposed on the first passivation film 150a, so as to expose a part of the first and second drain electrodes DE1a and DE2a. The organic insulating film 150b may include a photosensitive material. In this case, since a photoresist does not need to be used at the time of patterning the organic insulating film 150b for defining the first contact hole CNT1a and the second contact hole CNT2a, the process efficiency may be improved.

A first opening OP1 may be defined in the common electrode CEa in order to avoid the short circuit with the first pixel electrode PE1a. A second opening OP2 may be defined in the common electrode CEa in order to avoid the short circuit with the second pixel electrode PE2a.

The second passivation film 150c may be disposed on the common electrode CEa. In an exemplary embodiment, the second passivation film 150c may include an inorganic insulating material such as silicon nitride or silicon oxide.

The first and second pixel electrodes PE1a and PE1b may be disposed on the second passivation film 150c. The first and second pixel electrodes PE1a and PE1b may be disposed to overlap at least a part of the common electrode CEa. That is, the first and second pixel electrodes PE1a and PE1b may overlap at least a part of the common electrode CEa in a direction perpendicular to the lower substrate 110, so as to form a horizontal electric field. The first and second pixel electrodes PE1a and PE1b may be insulated by the common electrode CEa and the second passivation film 150c.

A plurality of slits SLTa and SLTb may be defined in the passivation film 150c. The plurality of slits SLTa and SLTb generate a fringe field between the common electrode CEa and each of the first and second pixel electrodes PE1a and PE1b, thereby helping liquid crystal molecules to rotate in a specific direction.

Referring to FIG. 9, in an exemplary embodiment, each of the slits SLTa and SLTb of the first and second pixel electrodes PE1a and PE1b may extend in the substantially same direction as the direction d1 that is the extension direction of the second data line DL2. Further, each of the slits SLTa and SLTb of the first and second pixel electrodes PE1a and PE1b may be bent at the central portion thereof at an obtuse angle. The upper and lower sides of the first and second pixel electrodes PE1a and PE1b may be divided into different domains from each other based on the bent portions of the slits SLTa and SLTb. The shape of each of the slits SLTa and SLTb of the first and second pixel electrodes PE1a and PE1b and the shape of the domain are not limited to those shown in FIG. 9, and may be various.

Next, a display device according to another exemplary embodiment of the invention, which is not provided with the organic insulating film 150b is not provided, will be described with reference to FIG. 10.

Referring to FIG. 10, in the display device according to another exemplary embodiment of the invention, the common electrode CEa may be disposed on the first passivation film 150a. As described above, the first passivation film 150a may include an inorganic insulating material such as silicon nitride or silicon oxide. In an exemplary embodiment, in an exemplary embodiment, the passivation film 150a may have a thickness of about 2000 angstroms (Å) to about 4000 Å, for example. Then, the second passivation film 150c may be disposed on the common electrode CEa. In an exemplary embodiment, the material of the second passivation film 150c may be the same as the material of the first passivation film 150a.

That is, in FIG. 10, the organic insulating film 160b shown in FIG. 9 is omitted.

More specifically, each of the first and second passivation films 150a and 150c is a inorganic material film having a thickness of about 2000 Å to about 4000 Å. That is, since the organic insulating film having a thickness of about 3 micrometers (μm) to about 4 μm is omitted, it is not necessary to form another organic insulating film, so that a manufacturing process may be more simplified, and there are advantages in terms of cost. For the convenience of explanation, it is shown in FIG. 10 that the upper surface of the second passivation film 150c, on which the first and second pixel electrodes PE1a and PE2a are disposed, becomes even. However, the invention is not limited thereto.

It is shown in FIGS. 8 to 10 that the common electrode CEa is disposed under the first and second pixel electrodes PE1a and PE2a base on the lower substrate 110. However, the invention is not limited thereto. That is, the common electrode CEa may be disposed over the first and second pixel electrodes PE1a and PE2a. In this case, the common electrode CEa includes a plurality of slits, thereby forming a fringe filed together with the first and second pixel electrodes PE1a and PE2a.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A display device comprising:
   a first data line extending in a first direction;
   a first pixel electrode disposed at one side of the first data line;
   a second pixel electrode disposed at the other side of the first data line;
   a first switching device including a gate electrode connected with a first gate line in a second direction different from the first direction and a first electrode connected with the first pixel electrode;
   a second switching device including a gate electrode connected with a second gate line extending in the second direction and a first electrode connected with the second pixel electrode,
   wherein the first data line includes first and second branch lines, wherein a single line portion of the first data line diverges into the first and second branch lines at a first node and the first and second branch lines merge with each other into another single line portion of the first data line at a second node,
   a second electrode of the first switching device is connected with the first branch line;
   a second electrode of the second switching device is connected with the second branch line;

a first gate line extending in a second direction different from the first direction; and
a second gate line extending in the second direction and disposed adjacent to the first gate line,
wherein
the first and second pixel electrodes are respectively disposed on the same layer as that on which the first and second gate lines are disposed, and
the first and second pixel electrodes are respectively insulated from the first and second gate lines.

2. The display device of claim 1, further comprising:
a common electrode at least partially overlapping each of the first and second pixel electrodes.

3. The display device of claim 2,
wherein the first and second pixel electrodes are respectively disposed on a different layer from that on which the first and second gate lines are disposed.

4. The display device of claim 2, further comprising:
a second data line extending in the first direction and disposed adjacent to the first data line; and
a common line disposed between the first and second data lines.

5. The display device of claim 4,
wherein the common line is electrically connected with the common electrode.

6. The display device of claim 2,
wherein the first electrode of the first switching device includes a first extension portion overlapping the first gate line, and the first electrode of the second switching device includes a second extension portion overlapping the second gate line.

7. The display device of claim 2,
wherein a plurality of slits is defined in the common electrode.

8. The display device of claim 1,
wherein the first pixel electrode is electrically connected with the first electrode of the first switching device through a first contact hole, and the second pixel electrode is electrically connected with the first electrode of the second switching device through a second contact hole.

9. The display device of claim 1, further comprising:
a first connecting electrode connected with the first pixel electrode and the first electrode of the first switching device; and
a second connecting electrode connected with the second pixel electrode and the first electrode of the second switching device.

10. The display device of claim 9,
wherein the first and second connecting electrodes are disposed on the same layer as that on which the common electrode is disposed.

11. A display device comprising:
a substrate;
first and second gate lines extending on the substrate in a first direction and disposed adjacent to each other;
a first data line extending in a second direction different from the first direction and including first and second branch lines, wherein a single line portion of the first data line diverges into the first and second branch lines at a first node and the first and second branch lines merge with each other into another single line portion of the first data line at a second node;
a first pixel electrode disposed at one side of the first data line;
a second pixel electrode disposed at the other side of the first data line;
a first switching device including a gate electrode connected with the first gate line, one electrode connected with the first branch line of the first data line, and the other electrode connected with the first pixel electrode;
a second switching device including a gate electrode connected with the second gate line, one electrode connected with the second branch line of the first data line, and the other electrode connected with the second pixel electrode;
a gate insulating film disposed between the first gate line and the first date line and between the second gate line and the first data line;
a first passivation film disposed on the gate insulating film;
a common electrode disposed on the first passivation film and at least partially overlapping the first and second pixel electrodes;
a first connecting electrode connected with the first pixel electrode and the other electrode of the first switching device; and
a second connecting electrode connected with the second pixel electrode and the other electrode of the second switching device,
wherein the first and second pixel electrodes are disposed on the same layer as that on which the first and second gate lines are disposed, and the first and second connecting electrodes are disposed on the same layer as that on which the common electrode is disposed.

12. The display device of claim 11,
wherein the first pixel electrode directly contacts the other electrode of the first switching device, and the second pixel electrode directly contacts the other electrode of the second switching device.

13. A display device, comprising:
a substrate;
first and second gate lines disposed on the substrate;
a first data line disposed on the first and second gate lines and including first and second branch lines, wherein a single line portion of the first data line diverges into the first and second branch lines at a first node and the first and second branch lines merge with each other into another single line portion of the first data line at a second node;
a first switching device disposed on the same layer as that on which the first data line is disposed, and including one electrode connected with the first gate line and the first branch line;
a second switching device disposed on the same layer as that on which the first data line is disposed, and including one electrode connected with the second gate line and the second branch line;
a first pixel electrode connected with one electrode of the first switching device;
a second pixel electrode connected with one electrode of the second switching device;
a common electrode at least partially overlapping the first and second pixel electrodes;
a first passivation film disposed on one electrode of the first switching device and exposing a part of one electrode of the first switching device; and
a second passivation film disposed between the first pixel electrode and the common electrode and between the second pixel electrode and the common electrode.

14. The display device of claim 13, further comprising:
an organic insulating film disposed between the first passivation film and the second passivation film.

15. The display device of claim 14,
wherein the common electrode is disposed on the organic insulating film, and the first and second pixel electrodes are disposed on the second passivation film.

* * * * *